United States Patent [19]

Meakin

[11] Patent Number: 5,063,086
[45] Date of Patent: Nov. 5, 1991

[54] VACUUM DEPOSITION PROCESS AND APPARATUS FOR PRODUCING FILMS HAVING HIGH UNIFORMITY

[75] Inventor: Douglas B. Meakin, Harrow-on-the-Hill, England

[73] Assignee: The General Electric Company p.l.c., England

[21] Appl. No.: 399,474

[22] PCT Filed: Dec. 16, 1988

[86] PCT No.: PCT/GB88/01126

§ 371 Date: Sep. 5, 1989

§ 102(e) Date: Sep. 5, 1989

[87] PCT Pub. No.: WO89/05872

PCT Pub. Date: Jun. 29, 1989

[30] Foreign Application Priority Data

Dec. 18, 1987 [GB] United Kingdom ............. 8729548

[51] Int. Cl.⁵ .................. C23C 16/40; C23C 16/44; C23C 16/46; C23C 16/52
[52] U.S. Cl. ..................... 427/255.3; 427/248.1; 427/255; 427/255.2
[58] Field of Search ............ 427/248.1, 255, 255.3, 427/255.2; 118/715, 725, 728

[56] References Cited

U.S. PATENT DOCUMENTS

| | | | |
|---|---|---|---|
| 4,239,811 | 12/1980 | Kentage | 437/238 |
| 4,268,538 | 5/1981 | Toole et al. | 427/255.3 |
| 4,513,026 | 4/1985 | Miyamoto et al. | 427/255.3 |
| 4,780,334 | 10/1988 | Ackerman | 427/248.1 |
| 4,810,673 | 3/1989 | Freeman | 427/255.3 |
| 4,832,986 | 5/1989 | Gladfeller et al. | 427/248.1 |
| 4,849,259 | 7/1989 | Biro et al. | 427/255.3 |

FOREIGN PATENT DOCUMENTS

| | | | |
|---|---|---|---|
| 0089242 | 9/1983 | European Pat. Off. | |
| 0143701 | 6/1985 | European Pat. Off. | |
| 0238315 | 9/1987 | European Pat. Off. | 427/248.1 |
| 54-65197 | 5/1979 | Japan | 427/255.3 |
| 1128556 | 9/1968 | United Kingdom | |
| 1518564 | 7/1978 | United Kingdom | |
| 1575578 | 9/1980 | United Kingdom | |
| 2041983 | 9/1980 | United Kingdom | |
| 1598146 | 9/1981 | United Kingdom | |
| 2163181 | 2/1986 | United Kingdom | |
| 2177119 | 1/1987 | United Kingdom | |
| 2191510 | 12/1987 | United Kingdom | |

OTHER PUBLICATIONS

Blocher, *Deposition Tech. for Films & Coatings*, (Noyes, Park Ridge N.J.) c. 1982, pp. 335, 351–356.

*Primary Examiner*—Shrive Beck
*Assistant Examiner*—Margaret Burke
*Attorney, Agent, or Firm*—Kirschstein, Ottinger, Israel & Schiffmiller

[57] ABSTRACT

In order to deposit films of materials, such as polysilicon or silicon dioxide, on major surfaces of substrates by a low-pressure chemical vapor deposition (LPCVD) process, gas, such as a silane gas, is admitted to a chamber at one end and is pumped through the chamber by a pump. The substrates are mounted such that the general direction of gas flow is perpendicular to the substrate major surface, and are heated to cause reaction of the gas to form the required film. In order to achieve uniformity of the deposited films over a number of substrates, the pressure in the deposition chamber is maintained below 10m Torr.

5 Claims, 1 Drawing Sheet

HEATER

VACUUM DEPOSITION PROCESS AND APPARATUS FOR PRODUCING FILMS HAVING HIGH UNIFORMITY

BACKGROUND OF THE INVENTION

1. Field of the Invention

This invention relates to the deposition of films of materials, such as polysilicon or silicon dioxide, on substrates, using a low-pressure chemical vapour deposition (LPCVD) process. Such deposition techniques may be used in the fabrication of integrated circuits. The low-pressure deposition process is then particularly advantageous, as it allows a high IC wafer throughput to be achieved.

2. Description of the Related Art

Although deposition of some materials by the LPCVD process is simple, for some multi-compound reactions serious problems are encountered. One example is the deposition of silicon dioxide by the reaction of silane with oxygen, in which non-uniformity of the resultant films across the wafers is a problem. The same problem also arises with certain other compounds.

SUMMARY OF THE INVENTION

It is an object of the invention to provide an LPCVD process in which such problem is alleviated.

According to one aspect of the invention there is provided a low-pressure chemical vapour deposition process for depositing a film of a material on at least one major surface of a substrate, the process comprising the steps of mounting the substrate in a deposition chamber; feeding into the chmber at least one reactant gas for forming the film while maintaining the pressure in the chamber at a level below 10 mTorr, the substrate being so orientated that the general direction of gas flow is substantially perpendicular to said surface of the substrate; and applying heat to cause reaction of the gas or gases to form the film on said surface.

According to another aspect of the invention there is provided apparatus for forming a film of a material on at least one major surface of a substrate, the apparatus comprising a deposition chamber; means to maintain a pressure below 10 mTorr in the chamber; means to feed at least one reactant gas into the chamber so that the gas or gases flow through the chamber; means to support the substrate within the chamber so that said surface is substantially perpendicular to the gas flow; and means to apply heat to cause reaction of the gas or gases to form said film on said surface.

BRIEF DESCRIPTION OF THE DRAWINGS

An embodiment of the invention will now be described, by way of example, with reference to the accompanying drawings, wherein.

DETAILED DESCRIPTION OF THE PREFERRED EMBODIMENT

Figure 1:
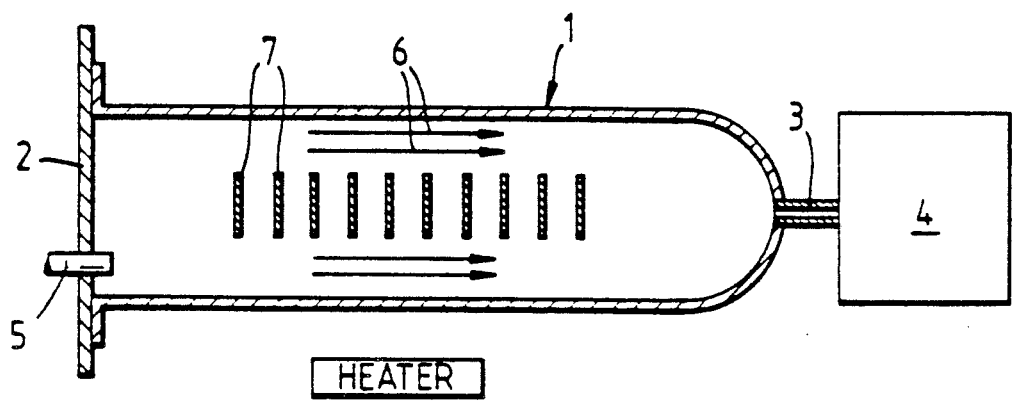
FIG. 1 is a schematic view in cross-section through a known vacuum deposition chamber.

Referring to FIG. 1, a conventional deposition apparatus comprises a deposition chamber 1 having a closure 2 at one of its ends and a connection 3 to a pump 4 at the other end. An inlet 5 is provided at the closure end, so that reactant gas or gases can be fed into the chamber. The resultant gas flow will be generally in the direction of arrows 6. Substrates 7 on which films are to be deposited are mounted in the chamber with their major surfaces substantially perpendicular to the general gas flow.

Films are deposited on the major surfaces of the substrates by heating the gas or gases at the substrate surfaces to cause the required reaction.

A typical deposition process involves the reaction of silane gas with oxygen to produce a silicon dioxide film i.e., $$SiH_4 + O_2 \rightarrow SiO_2 + 2H_2$$

The normal deposition chamber pressure for that process is around 500 mTorr and the reaction temperature is around 420° C.

Figure 2:
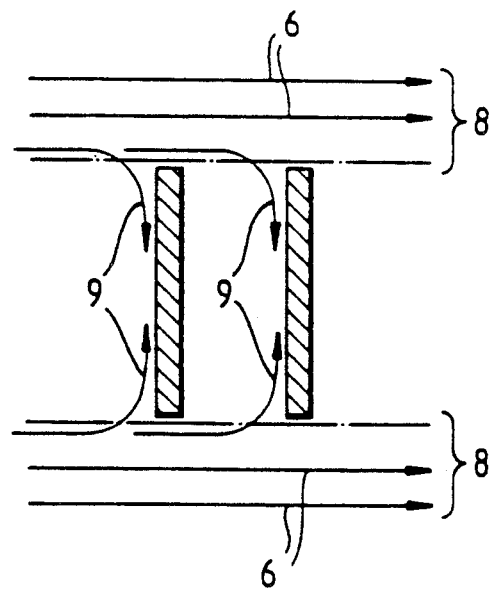
FIG. 2 is a schematic view showing schematically the gas flow around substrates mounted in the chamber of FIG. 1.

A problem which is encountered with that process is illustrated schematically in FIG. 2. The general direction is represented by arrows 6, as above. It will be seen that the main gas flow takes place generally in an annular region 8 around the edges of the substrates. However, in order to deposit the required films on the major surfaces of the substrates, some part of the gas flow must make contact with those surfaces, as indicated by arrows 9.

As the reactant gases diffuse from the annular region 8 towards the centre of a substrate, the gases become partially used up by the reaction at the surface. If the rate of reaction is greater than the rate of mass transport of the gases by diffusion across the surface, there will be a depletion of reactant availability towards the centre of the substrate, and a non-uniform film will result.

If, on the other hand, the reaction rate is very slow compared with the rate of diffusion of the gases, there will be an adequate supply of reactants right across the surface of the substrate, and a very uniform film will result.

There is a "figure of merit", the Sherwood Number, which allows predictions to be made on the uniformity of the resultant film. The Sherwood Number Sh is given by

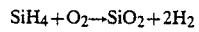

$$Sh = \frac{k_D d}{D}$$

where $k_D$ is the rate of surface reaction d is the diffusion distance, i.e., the substrate radius in the present case, and D is the diffusivity of the reactant gases at the temperature and pressure of the reaction.

If $Sh > 1$ the process is mass transport limited, and if $Sh > 1$ it is surface limited. Hence, to achieve uniformity of the film it is necessary to ensure that $Sh < < 1$.

In the conventional diffusion process, where the conditions make $Sh > 1$, a cage of quartz rods is placed around the substrate to absorb most of the reactive species responsible for the enhanced growth near the substrate edge which causes the non-uniformity of the film, in an attempt to even out their concentration across the substrate.

However, if D in equation (1) can be increased, the value of Sh will decrease and improved uniformity can be achieved without the need for such a quartz rod arrangement.

It has been found that films can be successfully deposited at very low pressures, even as low as 1 mTorr. Furthermore, it has been found that the diffusivity of the gases increases with decrease in pressure, so that the value of D increases. In fact, the value of D increases to such an extent that the value of Sh can become very much less than 1 in a number of processes for which severe non-uniformity of the resultant films is experienced for normal LPCVD pressures. Hence, such processes can be rendered usable by merely reducing the chamber pressure to a lower than usual pressure.

In the present invention, therefore, the pressure in the chamber 1 is reduced to 10 mTorr or less.

It has been found that, in a conventional LPCVD process for providing doped polysilicon from silane at a normal pressure exceeding 200 mTorr and at a temperature of 630° C. there is a ±70% non-uniformity across the substrate. If, on the other hand, the process is carried out at 2.5 mTorr, in accordance with the invention, the uniformity is ±1%.

It is also found that in a conventional LPCVD process for producing an undoped polysilicon film from silane, the temperature must be maintained below about 700° C. at a pressure greater than 150 mTorr, because above this temperature the silane polymerises to give very reactive species, so resulting in a non-uniform growth. At the very low pressures of the present invention, the collisional frequency is so low that no polymerisation can take place, so as uniform deposition is obtained, even at 900° C.

Considerable improvements are also to be expected in respect of films formed by the reaction of $SiH_4+O_2$ and the reaction of $SiH_4+N_2O$, and also doped films fromed from $SiH_4+O_2+PH_3+AsH_3$, by using the very low pressures in accordance with the present invention.

I claim:

1. A low-pressure chemical vapor deposition process for depositing a substantially uniform film on at least one major surface of a substrate, the process comprising the steps of:
   (a) feeding at least one reactant film-forming gas into a deposition chamber along a gas flow direction;
   (b) mounting the substrate within the chamber, and orienting said at least one major surface to be substantially perpendicular to the gas flow direction;
   (c) heating said at least one reactant gas at said at least one major surface to cause a reaction of said at least one reactant gas, thereby forming the film on said at least one major surface; and
   (d) maintaining pressure within the chamber at a level below 10 mTorr during the heating step, and maintaining a value of Sherwood number indicative of the uniformity of the film much smaller than unity, whereby the film formed on said at least one major surface is substantially uniform.

2. The process as claimed in claim 1, wherein said feeding step is performed by employing silane as said at least one reactant gas.

3. The process as claimed in claim 2, wherein said feeding step is performed by adding oxygen to the silane.

4. The process as claimed in claim 3, wherein said feeding step is performed by adding phosphine and arsine to the silane and the oxygen.

5. The process as claimed in claim 2, wherein said feeding step is performed by adding nitrous oxide to the silane.

* * * * *